US009620434B1

(12) United States Patent
Joshi et al.

(10) Patent No.: US 9,620,434 B1
(45) Date of Patent: Apr. 11, 2017

(54) HIGH TEMPERATURE BONDING PROCESSES INCORPORATING METAL PARTICLES AND BONDED SUBSTRATES FORMED THEREFROM

(71) Applicant: Toyota Motor Engineering & Manufacturing North America, Inc., Erlanger, KY (US)

(72) Inventors: Shailesh N. Joshi, Ann Arbor, MI (US); Masao Noguchi, Ann Arbor, MI (US)

(73) Assignee: Toyota Motor Engineering & Manufacturing North America, Inc., Erlanger, KY (US)

( * ) Notice: Subject to any disclaimer, the term of this patent is extended or adjusted under 35 U.S.C. 154(b) by 0 days.

(21) Appl. No.: 15/062,893

(22) Filed: Mar. 7, 2016

(51) Int. Cl.
*H01L 21/00* (2006.01)
*H01L 23/48* (2006.01)
(Continued)

(52) U.S. Cl.
CPC ...... *H01L 23/3735* (2013.01); *H01L 23/3675* (2013.01); *H01L 24/27* (2013.01);
(Continued)

(58) Field of Classification Search
CPC ..... H01L 25/0567; H01L 24/30; H01L 24/83; H01L 24/81; H01L 24/29; H01L 25/0655; H01L 25/50

See application file for complete search history.

(56) References Cited

U.S. PATENT DOCUMENTS 6,803,116 B2 * 10/2004 Ikeda ................. B23K 35/0222
257/778
7,714,444 B2 * 5/2010 Nakatani .............. B23K 1/0016
257/772

(Continued)

FOREIGN PATENT DOCUMENTS

EP           2490252 A2    8/2012
JP           H0661277      3/1994

OTHER PUBLICATIONS

Tollefsen, et al., "High Temperature Interconnect and Die Attach Technology: Au—Sn SLID Bonding," IEEE Transactions on Components, Packaging and Manufacturing Technology, vol. 3, No. 6, Jun. 2013, p. 904.

*Primary Examiner* — Alonzo Chambliss
(74) *Attorney, Agent, or Firm* — Dinsmore & Shohl LLP

(57) ABSTRACT

A method of bonding a first substrate to a second substrate includes disposing a first high melting point metal layer onto a first substrate, disposing a first low melting point metal layer onto the first high melting point metal layer, disposing a second high melting point metal layer onto a second substrate, and disposing a second low melting point metal layer onto the second high melting point metal layer. The method further includes applying precursor metal particles onto the first and/or second low melting point metal layers, positioning the first and second low melting point metal layers such that the precursor metal particles contact both the first and second low melting point metal layers, and bonding the first substrate to the second substrate by heating (Continued)

the precursor metal particles and each metal layer to form an intermetallic alloy bonding layer between the first and second substrates.

20 Claims, 6 Drawing Sheets

(51) Int. Cl.
    *H05K 1/11*     (2006.01)
    *H01L 23/373*     (2006.01)
    *H01L 23/367*     (2006.01)
    *H01L 23/00*     (2006.01)
    *H01L 25/065*     (2006.01)
    *H01L 25/00*     (2006.01)

(52) U.S. Cl.
    CPC .............. *H01L 24/32* (2013.01); *H01L 24/83* (2013.01); *H01L 25/0657* (2013.01); *H01L 25/50* (2013.01); *H01L 2224/27462* (2013.01); *H01L 2224/29082* (2013.01); *H01L 2224/29198* (2013.01); *H01L 2224/29211* (2013.01); *H01L 2224/29224* (2013.01); *H01L 2224/29239* (2013.01); *H01L 2224/29247* (2013.01); *H01L 2224/29255* (2013.01); *H01L 2224/29311* (2013.01); *H01L 2224/29324* (2013.01); *H01L 2224/29339* (2013.01); *H01L 2224/29347* (2013.01); *H01L 2224/29355* (2013.01); *H01L 2224/32245* (2013.01); *H01L 2224/32503* (2013.01); *H01L 2224/83193* (2013.01); *H01L 2224/83894* (2013.01); *H01L 2924/201* (2013.01); *H01L 2924/20106* (2013.01); *H01L 2924/20107* (2013.01); *H01L 2924/20108* (2013.01)

(56) References Cited

U.S. PATENT DOCUMENTS

| | | | |
|---|---|---|---|
| 8,418,910 | B2 | 4/2013 | Yamakami et al. |
| 8,487,437 | B2 | 7/2013 | Elenius et al. |
| 8,513,806 | B2 | 8/2013 | Otsuka et al. |
| 8,536,047 | B2 | 9/2013 | Zhang et al. |
| 8,592,986 | B2 | 11/2013 | Otsuka et al. |
| 9,024,205 | B2 | 5/2015 | Uzoh |
| 2007/0001313 | A1* | 1/2007 | Fujimoto ................ H01L 24/11 257/778 |
| 2010/0053924 | A1* | 3/2010 | Ueshima ............... C22C 1/0483 361/784 |
| 2010/0220455 | A1* | 9/2010 | Hsu ...................... G01R 31/026 361/784 |
| 2013/0252399 | A1* | 9/2013 | Leduc ................. H01L 21/0226 438/455 |

* cited by examiner

HIGH TEMPERATURE BONDING PROCESSES INCORPORATING METAL PARTICLES AND BONDED SUBSTRATES FORMED THEREFROM

TECHNICAL FIELD

The present specification generally relates bonded substrate assemblies and, more particularly, methods of bonding substrate assemblies using metal layers and metal particles.

BACKGROUND

Power semiconductor devices, such as those fabricated from SiC (silicon carbide), may be designed to operate at very high operating temperatures (e.g., greater than 250° C.). Such power semiconductor devices may be bonded to a cooling device, such as a heat sink or a liquid cooling assembly, for example. The cooling device removes heat from the power semiconductor device to ensure that it operates at a temperature that is below its maximum operating temperature. The bonding layer that bonds the power semiconductor device to the cooling device must be able to withstand the high operating temperatures of the power semiconductor device.

Accordingly, a need exists for alternative methods for high temperature bonding of substrates for forming a strengthened bonding layer between a pair of substrates.

SUMMARY

In one embodiment, a method of bonding a first substrate to a second substrate includes disposing a first high melting point metal layer onto a bonding surface of a first substrate, disposing a first low melting point metal layer onto the first high melting point metal layer, disposing a second high melting point metal layer onto a bonding surface of a second substrate, and disposing a second low melting point metal layer onto the second high melting point metal layer. The method further includes applying a plurality of precursor metal particles onto at least one of the first low melting point metal layer and the second low melting point metal layer, positioning the first low melting point metal layer and the second low melting point metal layer such that the plurality of precursor metal particles contact both the first and second low melting point metal layers, and bonding the first substrate to the second substrate by heating the plurality of precursor metal particles, the first high melting point metal layer, the first low melting point metal layer, the second low melting point metal layer, and the second high melting point metal layer to a bonding temperature for a bonding period to form an intermetallic alloy bonding layer between the first substrate and the second substrate.

In another embodiment, a method of bonding a first substrate to a second substrate includes applying a plurality of precursor metal particles including high melting point metal particles and low melting point metal particles onto at least one surface of a first plated metal stack and a second plated metal stack. The first plated metal stack includes at least one high melting point metal layer plated to at least one low melting point metal layer and is coupled to a bonding surface of a first substrate. The second plated metal stack includes at least one high melting point metal layer plated to at least one low melting point metal layer and is coupled to a bonding surface of a second substrate. Further, the plurality of precursor metal particles includes more high melting point metal particles than low melting point metal particles.

The method further includes positioning the first plated metal stack and the second plated metal stack such that the plurality of precursor metal particles contact both the first and second plated metal stacks and heating the first plated metal stack, the second plated metal stack, and the plurality of precursor metal particles to form an intermetallic alloy bonding layer between the first substrate and the second substrate. Moreover, the intermetallic alloy bonding layer includes a plurality of integrated metal particles, the plurality of integrated metal particles include the high melting point metal particles of the plurality of precursor metal particles, and the intermetallic alloy bonding layer bonds the first substrate to the second substrate.

In yet another embodiment, a bonded substrate system includes a first substrate, a second substrate, and an intermetallic alloy bonding layer positioned between and bonded to the first substrate and the second substrate, the intermetallic alloy bonding layer includes a first alloy region, a second alloy region and a particle-alloy matrix region. The first alloy region extends between the first substrate and a first boundary region of the particle-alloy matrix region. The second alloy region extends between the second substrate and a second boundary region of the particle-alloy matrix region. The first and second alloy regions include at least one low melting point metal diffused into at least one high melting point metal. Further, the particle-alloy matrix region includes a plurality of integrated metal particles dispersed within an alloy having at least one low melting point metal diffused into at least one high melting point metal.

These and additional features provided by the embodiments described herein will be more fully understood in view of the following detailed description, in conjunction with the drawings.

BRIEF DESCRIPTION OF DRAWINGS

The embodiments set forth in the drawings are illustrative and exemplary in nature and not intended to limit the subject matter defined by the claims. The following detailed description of the illustrative embodiments can be understood when read in conjunction with the following drawings, where like structure is indicated with like reference numerals and in which:

DETAILED DESCRIPTION

Referring generally to the figures, embodiments of the present disclosure are directed to methods for high temperature bonding of substrates and substrates formed therefrom. The methods include bonding a first substrate to a second substrate by positioning multiple high and low melting point metal layers between the first and second substrates, applying a plurality of precursor metal particles to one or more surfaces of the high and low melting point metal layers, and heating the metal layers and the plurality of precursor metal particles to form an intermetallic alloy bonding layer between the first substrate and the second substrate using a high temperature bonding process. The intermetallic alloy bonding layer includes integrated metal particles dispersed into a particle-alloy matrix region of the intermetallic alloy bonding layer. The integrated metal particles increase the strength of the intermetallic alloy bonding layer such that the intermetallic alloy bonding layer can withstand stress forces without cracking or otherwise deteriorating. Moreover, the use of precursor particles in the bonding process may decrease the bonding time, allowing the first substrate and the second substrate to be bonded together faster.

Various embodiments of methods for high temperature bonding of substrates and substrates formed therefrom are described in detail herein. Although exemplary methods for high temperature bonding of substrates are described in the context of power electronics applications (e.g., to bond a power semiconductor device to a cooling assembly in an inverter circuit of hybrid or electric vehicles), the use of methods described herein is not limited thereto. For example, exemplary methods and substrates formed therefrom that are described herein may be implemented in other semiconductor use applications and other applications to bond two components together.

Figure 1:
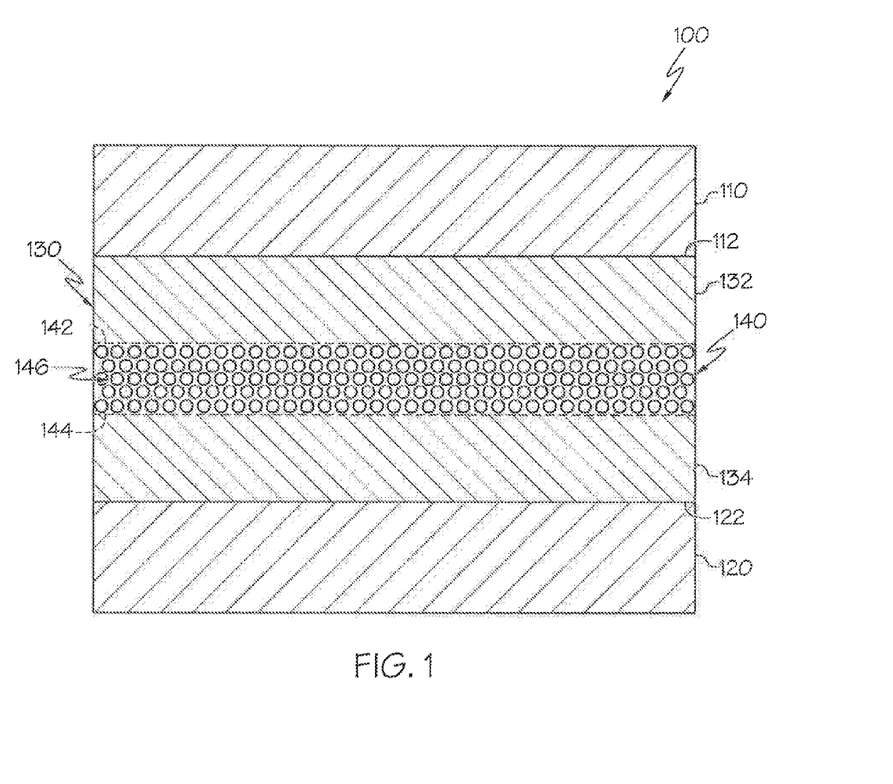
FIG. 1 schematically depicts a bonded substrate system, according to one or more embodiments shown and described herein.

Referring now to FIG. 1, a bonded substrate system 100 is depicted. The bonded substrate system 100 comprises a first substrate 110 bonded to a second substrate 120 by an intermetallic alloy bonding layer 130. The first and second substrates 110, 120 may comprise any substrate, such as substrates of a power electronics system, for example an inverter circuit of a hybrid or electric vehicle. In some embodiments, the first substrate 110 may comprise a semiconductor device and the second substrate 120 may comprise, a metal-ceramic-metal substrate, for example a direct bonded copper (DBC) substrate, or the like. Further, the first substrate 110 and/or the second substrate 120 may include a die that is made of Si (silicon) or SiC (silicon carbide) or like materials. Moreover, the first substrate 110 and/or the second substrate 120 may be made of a direct bonded metal such as direct bonded copper, direct bonded aluminum, and/or like materials. Although not shown, the second substrate 120 may be further bonded to a cooling assembly, such as a heat sink, a liquid based cooling device, and the like.

As depicted in FIG. 1, the intermetallic alloy bonding layer 130 of the bonded substrate system 100 is positioned between and bonded to the first substrate 110 and the second substrate 120. The intermetallic alloy bonding layer 130 includes a first alloy region 132, a second alloy region 134, and a particle-alloy matrix region 140 positioned between the first alloy region 132 and the second alloy region 134. The first alloy region 132 extends between a bonding surface 112 of the first substrate 110 and a first boundary region 142 of the particle-alloy matrix region 140. Further, the second alloy region 134 extends between a bonding surface 122 of the second substrate 120 and a second boundary region 144 of the particle-alloy matrix region 140. Moreover, as shown in FIG. 1, the bonding surface 112 of the first substrate 110 may face the bonding surface 122 of the second substrate 120.

The first and second alloy regions 132, 134 each comprise at least one high melting point metal and at least one low melting point metal, which may be diffused into the high melting point metal to form an at least partially intermetallic alloy during a transient liquid phase (TLP) bonding process, a diffusion bonding process, or a spark plasma sintering process, or any other suitable high temperature bonding processes for bonding substrates. The low melting point metal of the first and second alloy regions 132, 134 comprises a lower melting point than the high melting point metal. As a non-limiting example, the low melting point metal may comprise Sn or suitable like metal materials and the high melting point metal may comprise Ni, Cu, Al, Ag, other suitable like metal materials, or any combination thereof.

The particle-alloy matrix region 140 comprises a plurality of integrated metal particles 146 dispersed within an alloy. As used herein, the integrated metal particles 146 refer to particles of one or more high temperature metals, such as Ni, Cu, Al, Ag, or a combination thereof, that are dispersed within the intermetallic alloy bonding layer 130, in particular, within the particle-alloy matrix region 140. As described in more detail below, the integrated metal particles 146 may be formed from a plurality of precursor metal particles 246 (FIG. 2) that include particles of both high and low melting point metals. Further, the alloy of the particle-alloy matrix region 140, in which the integrated metal particles 146 are dispersed, may comprise at least one high melting point metal and at least one low melting point metal (e.g., Sn), which may be diffused into the high melting point metal (e.g., Ni, Cu, Al, Ag, or a combination thereof). For example, the alloy of the particle-alloy matrix region 140 may comprise the same composition as the first and second alloy regions 142, and 144. Moreover, at least some of the low melting point metals that form the alloy of the particle-alloy matrix region 140 may be formed from low melting point metal particles of the plurality of precursor metal particles 246.

In some embodiments, each of the integrated metal particles 146 may comprise a cross-sectional length, (e.g., diameter in embodiments comprising spherical particles) of between about 0.5 μm and about 10 μm, e.g., 0.75 μm, 1 μm, 3 μm 5 μm, 7 μm, 9 μm, or the like. Further, the plurality of integrated metal particles 146 dispersed within the particle-alloy matrix region 140 have a higher tensile strength than the surrounding alloy, for example, at least because the plurality of integrated metal particles 146 comprise high melting point metal particles. As such, integrated metal particles 146 operate as crack assertors within the particle-alloy matrix region 140, which may prevent or may crack propagation through the particle-alloy matrix region 140. Moreover, the increased tensile strength of the plurality of integrated metal particles 146 may increase the amount of shearing force, compression force, thermal expansion, thermal contraction, and the like, that the particle-alloy matrix region 140 and the intermetallic alloy bonding layer 130 can withstand without cracking or otherwise deteriorating.

Figure 2:
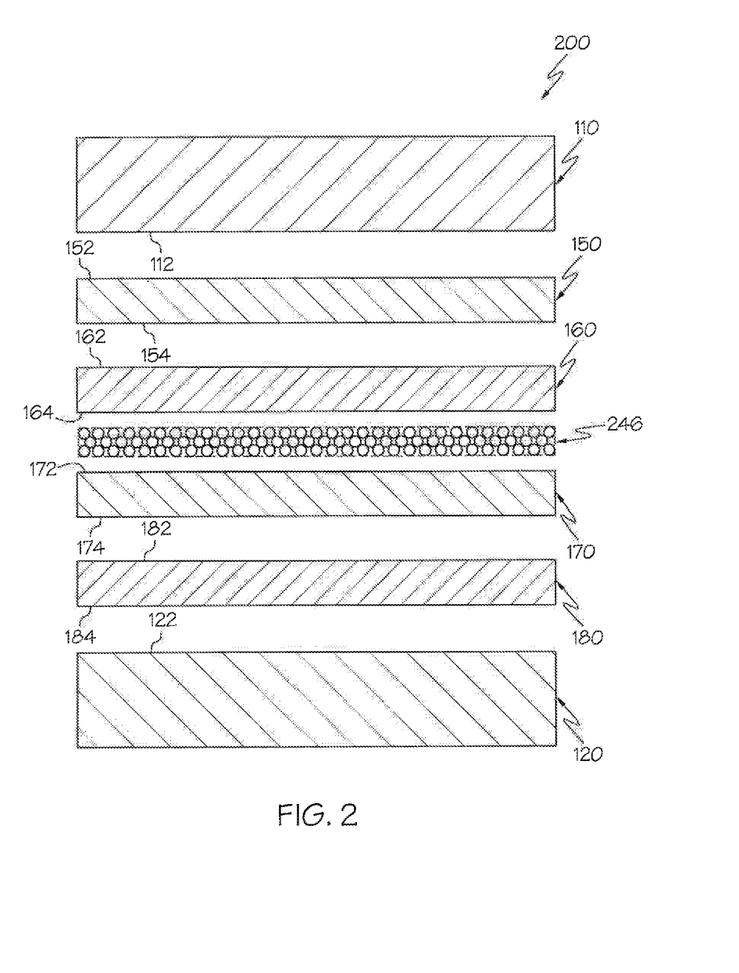
FIG. 2 schematically depicts an un-bonded substrate system, according to one or more embodiments shown and described herein.

Referring now to FIG. 2, an exploded view of an un-bonded substrate system 200 corresponding to the bonded substrate system 100 depicted in FIG. 1 is schematically depicted. The un-bonded substrate system 200 comprises the first and second substrates 110, 120, a plurality of metal layers, for example, a first high melting point metal layer 150, a first low melting point metal layer 160, a second low melting point metal layer 170, a second high melting point metal layer 180, and the plurality of precursor metal particles 246 comprising low melting point metal particles and high melting point metal particles. Each metal layer 150, 160, 170, 180 may be positioned between the first and second substrates 110, 120 and the plurality of precursor metal particles 246 may be positioned between one or more pairs of adjacent metal layers 150, 160, 170, 180 to form the un-bonded substrate system 200. For example, as depicted in FIG. 2, the plurality of precursor metal particles 246 may be positioned between the first and second low melting point metal layers 160, 170. Further, while four metal layers 150, 160, 170, 180 are depicted in FIG. 2, it should be understood that any number of metal layers are contemplated, for example six metal layers, eight metal layers, ten metal layers, or the like.

In operation, the un-bonded substrate system 200 may undergo a high temperature bonding process to form the bonded substrate system 100 of FIG. 1. For example, as described below with respect to FIGS. 3A-3E, the metal layers 150, 160, 170, 180 and the plurality of precursor metal particles 246 may form the intermetallic alloy bonding layer 130 of the bonded substrate system 100 after undergoing the high temperature bonding process. By using the plurality of precursor metal particles 246, the heating time required to form the bonded substrate system 100 from the un-bonded substrate system 200 may be less than the heating time required to form the bonded substrate system 100 without the use of the plurality of precursor metal particles 246.

Referring still to FIG. 2, the plurality of precursor metal particles 246 includes both low melting point metal particles and high melting point metal particles. For example, the low melting point metal particles may comprise Sn or suitable like metal materials and the high melting point metal particles may comprise Ni, Cu, Al, Ag, other suitable like metal materials, or any combination thereof. In some embodiments, the percentage of low melting point metal particles in the plurality of precursor metal particles 246 is greater than the percentage of high melting point metal particles. As a non-limiting example, the plurality of precursor metal particles 246 may comprise a range of about 60% to about 80% low melting point metal particles (e.g., 65%, 70%, 75%, or the like) and a range of about 20% to about 40% high melting point metal particles (e.g., 25%, 30%, 35%, or the like). As a non-limiting example, each of the plurality of precursor metal particles 246 may comprise a cross-sectional length, (e.g., diameter in embodiments comprising spherical particles) of between about 0.5 µm and about 10 µm, e.g., 0.75 µm, 1 µm, 3 µm 5 µm, 7 µm, 9 µm, or the like.

In some embodiments, the plurality of precursor metal particles 246 may be configured as loose particles in the form of a powder. In other embodiments, the plurality of precursor metal particles 246 may be provided in a paste including an organic binder, such that the plurality of precursor metal particles 246 are disposed in the organic binder. The organic binder may be an organic ingredient as understood by those skilled in the art that is used to bind together two or more materials. The paste may further include a flux component and an organic solvent (i.e., having a viscosity which is less than a viscosity associated with an organic binder).

The first and second low and high melting point metal layers 150, 160, 170, 180 may each comprise a first surface 152, 162, 172, 182 and a second surface 154, 164, 174, 184 which may be opposite the first surface 152, 162, 172, 182. When first and second low and high melting point metal layers 150, 160, 170, 180 are arranged in the un-bonded substrate system 200, as depicted in FIG. 2, each first surface 152, 162, 172, 182 may face the first substrate 110 and each second surface 154, 164, 174, 184 may face the second substrate 120.

In some embodiments, the first and second low melting point metal layers 160, 170 may each comprise a metal sheet, a metal foil, or the like, and may comprise Sn or suitable like metal materials, and in some embodiments, may include one or more non-metal additives. Further, the first low melting point metal layers 160 may comprise the same material or may comprise different materials than the second low melting point metal layer 170. The first and second high melting point metal layers 150, 180 may each comprise a metal sheet, a metal foil, or the like and may comprise Ni, Cu, Al, Ag, or suitable like metal materials, and in some embodiments, may include one or more non-metal additives. Further, the first high melting point metal layer 150 may comprise the same material or may comprise different materials than the second high melting point metal layer 180.

The first and second low melting point metal layers 160, 170 may each comprise a lower melting point than both the first and second high melting point metal layers 150, 180. As non-limiting examples, the first and second low melting point metal layers 160, 170 may each comprise a melting point less than about 400° C., less than about, 300° C., or less than about 260° C. Further, in some embodiments, the first and second low melting point metal layers 160, 170 each comprise a melting point between about 230° C. and about 260° C. As non-limiting examples, the first and second high melting point metal layers 150, 180 each comprise a melting point greater than about 500° C., for example, greater than about 600° C., greater than about 1000° C., or the like. For example, the first and second high melting point metal layers 150, 180 may comprise a melting point between about 600° C. and about 1500° C., for example, 700° C., 800° C., 900° C., 1000° C., 1100° C., 1200° C., 1300° C., 1400° C., or the like.

Figure 3A:
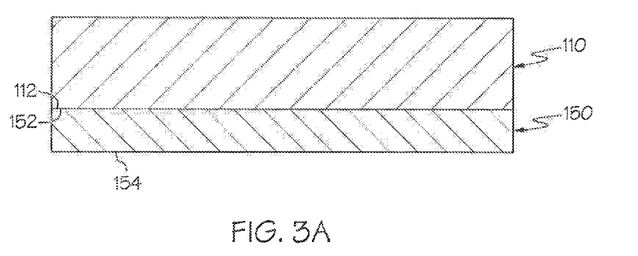
FIG. 3A schematically depicts a first high melting point metal layer positioned on a first substrate, according to one or more embodiments shown and described herein.

Referring now to FIGS. 3A-3E, a method of bonding the first substrate 110 to the second substrate 120 to form the bonded substrate system 100 of FIG. 1 is schematically depicted. While the method is described below in a particular order, it should be understood that other orders are contemplated. Referring now to FIG. 3A, the method first comprises disposing the first high melting point metal layer 150 onto the bonding surface 112 of the first substrate 110. In some embodiments, the method further comprises coupling the first high melting point metal layer 150 to the bonding surface 112 of the first substrate 110. The first high melting point metal layer 150 may be coupled to the bonding surface 112 of the first substrate 110 by any appropriate method. As a non-limiting example, the first high melting point metal layer 150 may be plated onto the bonding surface 112 of the first substrate 110, using an electroplating process or an electroless plating process, such as electroless deposition using an electrolytic cell, for example.

Figure 3B:
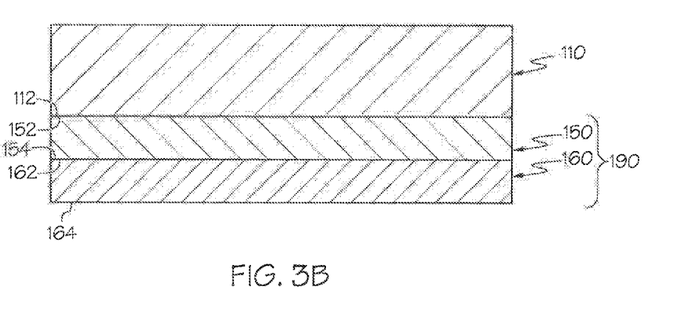
FIG. 3B schematically depicts a first low melting point metal layer positioned on the first high melting point metal layer of FIG. 3A, according to one or more embodiments shown and described herein.

Referring now to FIG. 3B, the method next includes disposing the first low melting point metal layer 160 onto the first high melting point metal layer 150, for example, onto the second surface 154 of the first high melting point metal layer 150. In some embodiments, the method comprises coupling the first low melting point metal layer 160 to the first high melting point metal layer 150. The first low melting point metal layer 160 may be coupled to the first high melting point metal layer 150 by any appropriate method. As a non-limiting example, the first low melting point metal layer 160 may be plated onto the second surface 154 of the first high melting point metal layer 150 using an electroplating process or an electroless plating process, such as electroless deposition using an electrolytic cell, for example.

Figure 3C:
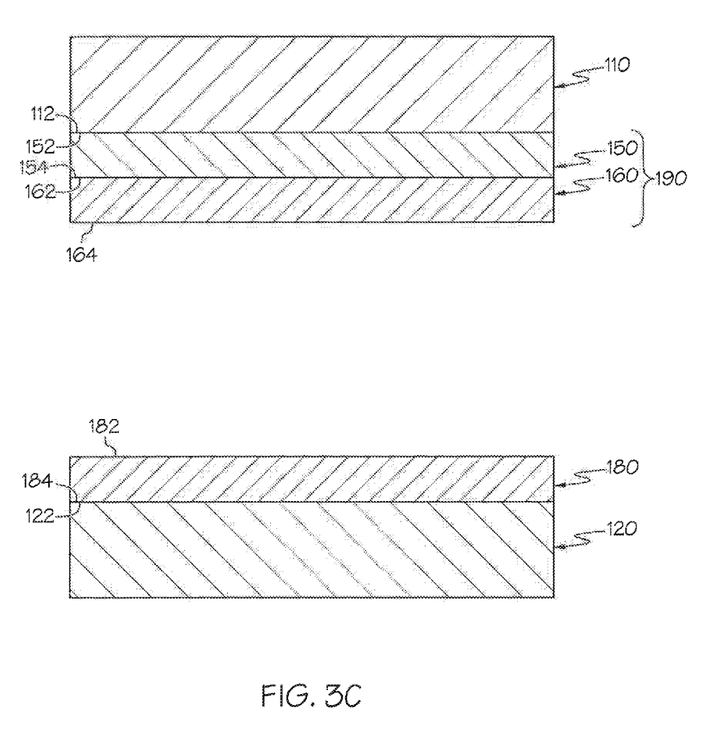
FIG. 3C schematically depicts the first substrate, the first high melting point metal layer, and the first low melting point metal layer of FIG. 3B and further depicts a second high melting point metal layer positioned on a second substrate, according to one or more embodiments shown and described herein.

As depicted in FIG. 3C, the method further includes disposing the second high melting point metal layer 180 onto the bonding surface 122 of the second substrate 120. In some embodiments, the method comprises coupling the second high melting point metal layer 180 to the bonding surface 122 of the second substrate 120. The second high melting point metal layer 180 may be coupled to the bonding surface 122 of the second substrate 120 by any appropriate method. As a non limiting example, the second high melting point metal layer 180 may be plated onto the bonding surface 122 of the second substrate 120 using an electroplating process or an electroless plating process, such as electroless deposition using an electrolytic cell, for example.

Figure 3D:
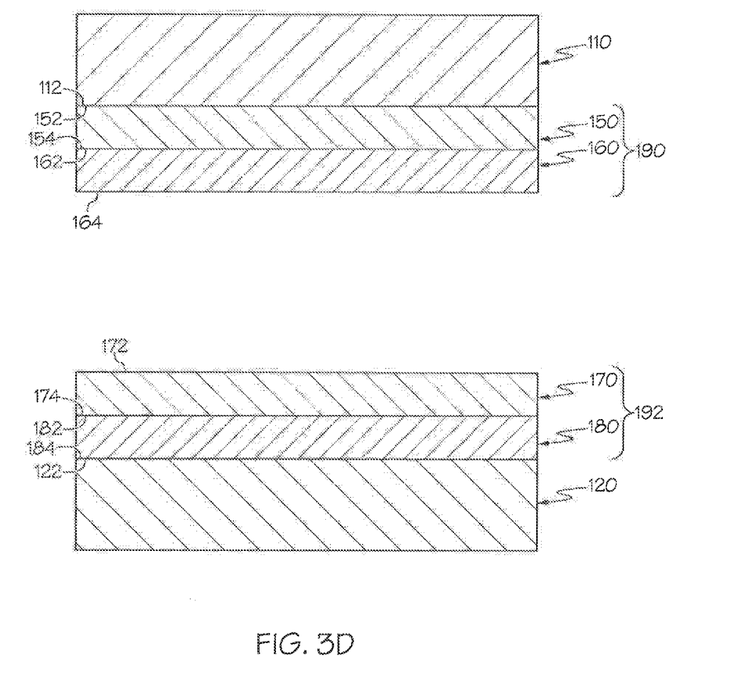
FIG. 3D schematically depicts a second low melting point metal layer positioned on the second high melting point metal layer of FIG. 3C, according to one or more embodiments shown and described herein.

As depicted in FIG. 3D, the method may additionally comprise disposing the second low melting point metal layer 170 onto the second high melting point metal layer 180, for example, onto the first surface 182 of the second high melting point metal layer 180. In some embodiments, the method comprises coupling the second low melting point metal layer 170 to the second high melting point metal layer 180. The second low melting point metal layer 170 may be coupled to the second high melting point metal layer 180 by any appropriate method. As a non-limiting example, the second low melting point metal layer 170 may be plated onto the first surface 182 of the second high melting point metal layer 180 using an electroplating process or an electroless plating process, such as electroless deposition using an electrolytic cell, for example.

Referring now to FIGS. 3B-3D, the first high melting point metal layer 150 and the first low melting point metal layer 160 may be collectively defined as a first metal stack 190. Further, in some embodiments, additional metal layers may be positioned therebetween such that the first high melting point metal layer 150 defines a first end of the first metal stack 190 and the first low melting point metal layer 160 defines a second end of the first metal stack 190. Moreover, the first high melting point metal layer 150, the first low melting point metal layer 160, and any additional metal layers therebetween may be plated together such that the first metal stack 190 comprises a first plated metal stack.

Further, the second high melting point metal layer 180 and the second low melting point metal layer 170 may be collectively defined as a second metal stack 192. Further, in some embodiments, additional metal layers may be positioned therebetween such that the second high melting point metal layer 180 defines a first end of the second metal stack 192 and the second low melting point metal layer 170 defines a second end of the second metal stack 192. Moreover, the second high melting point metal layer 180, the second low melting point metal layer 170, and any additional metal layers therebetween may be plated together such that the second metal stack 192 comprises a second plated metal stack.

Figure 3E:
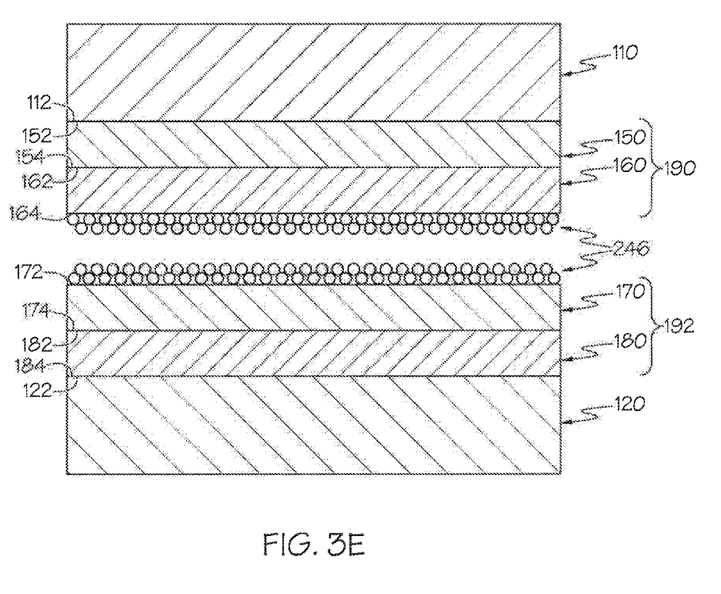
FIG. 3E schematically depicts a plurality of precursor metal particles positioned on the first and second low melting point metal layers of FIG. 3D, according to one or more embodiments shown and described herein.

Referring now to FIG. 3E, the method further includes applying the plurality of precursor metal particles 246 onto at least one of the second surface 164 of the first low melting point metal layer 160 and the first surface 172 of the second low melting point metal layer 170, for example, using a spraying process, a stenciling process, a deposition process, or a combination thereof. In some embodiments, the plurality of precursor metal particles 246 may be applied to both the second surface 164 of the first low melting point metal layer 160 and the first surface 172 of the second low melting point metal layer 170.

Referring still to FIG. 3E, the method further comprises positioning the second surface 164 of the first low melting point metal layer 160 and the first surface 172 of the second low melting point metal layer 170 such that the plurality of precursor metal particles 246 contact both the first and second low melting point metal layers 160, 170. Next, the first substrate 110 may be bonded to the second substrate 120 by forming the intermetallic alloy bonding layer 130 (FIG. 1) between the first substrate 110 and the second substrate 120 using a high temperature bonding process.

In some embodiments, the high temperature bonding process is a TLP bonding process comprising heating the plurality of precursor metal particles 246, the first high melting point metal layer 150, the first low melting point metal layer 160, the second low melting point metal layer 170, and the second high melting point metal layer 180 to a bonding temperature for a bonding period. The bonding temperature is greater than a melting point of both the first and second low melting point metal layers 160, 170 and lower than a melting point of both the first and second high melting point metal layers 150, 180.

For example, the bonding temperature may be greater than about 230° C., for example greater than about 260° C. In some embodiments, the bonding temperature may be between about 230° C. and about 600° C., for example, between about 230° C. to about 300° C., between about 230° C. to about 260° C., or the like, such that the low melting point metal materials (e.g., the first and second low melting point metal layers 160, 170 and a portion of the plurality of precursor metal particles 246) of the un-bonded substrate system 200 melt.

In operation, when the low melting point materials of the un-bonded substrate system 200 are heated to their melting point, the low melting point materials may melt and diffuse into the high melting point materials of the first and second high melting point metal layers 150, 180, to form the first and second alloy regions 132, 134 of the intermetallic alloy bonding layer 130 and form the alloy of the particle-alloy matrix region 140. Further, after the low melting point materials (e.g., the first and second low melting point metal layers 160, 170 and a portion of the plurality of precursor metal particles 246) melt and diffuse into the high melting point materials of the first and second high melting point metal layers 150, 180, the remaining high melting point metal particles of the plurality of precursor metal particles 246 are disposed within the alloy of the particle-alloy matrix region 140 and comprise the plurality of integrated metal particles 146 of the bonded substrate system 100 depicted in FIG. 1. Moreover, by forming the intermetallic alloy bonding layer 130 using the plurality of precursor metal particles 246, the bonding period may be decreased when compared to conventional bonding methods. For example, the bonding period may be less than 30 minutes, less than 20 minutes, less than 15 minutes, less the 10 minutes, or the like.

It should now be understood that embodiments described herein are directed to exemplary methods of bonding a first substrate to a second substrate by forming an intermetallic alloy bonding layer positioned between and bonded to the first substrate and the second substrate. The intermetallic alloy bonding layer includes first and second alloy regions and a particle-alloy matrix region. The particle-alloy matrix region includes integrated metal particles disposed within the particle-alloy matrix region to strengthen the intermetallic bonding layer. Moreover, methods described herein are directed to applying a plurality of precursor metal particles to a surface of at least one of a plurality of high and low melting point metal layers positioned between the first and second substrates. The plurality of precursor metal particles may facilitate faster bonding processes and may facilitate the formation of a strengthened intermetallic alloy bonding layer having integrated metal particles.

It is noted that the terms "substantially" and "about" and "approximately" may be utilized herein to represent the inherent degree of uncertainty that may be attributed to any quantitative comparison, value, measurement, or other representation. These terms are also utilized herein to represent the degree by which a quantitative representation may vary from a stated reference without resulting in a change in the basic function of the subject matter at issue.

While particular embodiments have been illustrated and described herein, it should be understood that various other changes and modifications may be made without departing from the spirit and scope of the claimed subject matter. Moreover, although various aspects of the claimed subject matter have been described herein, such aspects need not be utilized in combination. It is therefore intended that the appended claims cover all such changes and modifications that are within the scope of the claimed subject matter.

What is claimed is:

1. A method of bonding a first substrate to a second substrate, the method comprising:
    disposing a first high melting point metal layer onto a bonding surface of a first substrate;
    disposing a first low melting point metal layer onto the first high melting point metal layer;
    disposing a second high melting point metal layer onto a bonding surface of a second substrate;
    disposing a second low melting point metal layer onto the second high melting point metal layer;
    applying a plurality of precursor metal particles onto at least one of the first low melting point metal layer and the second low melting point metal layer;
    positioning the first low melting point metal layer and the second low melting point metal layer such that the plurality of precursor metal particles contacts both the first and second low melting point metal layers; and
    bonding the first substrate to the second substrate by heating the plurality of precursor metal particles, the first high melting point metal layer, the first low melting point metal layer, the second low melting point metal layer, and the second high melting point metal layer to a bonding temperature for a bonding period to form an intermetallic alloy bonding layer between the first substrate and the second substrate.

2. The method of bonding a first substrate to a second substrate of claim 1, wherein the bonding temperature is greater than a melting point of both the first and second low melting point metal layers and lower than a melting point of both the first and second high melting point metal layers.

3. The method of bonding a first substrate to a second substrate of claim 1, wherein the bonding temperature is between about 230° C. and about 300° C.

4. The method of bonding a first substrate to a second substrate of claim 1, wherein the bonding period is less than about 30 minutes.

5. The method of bonding a first substrate to a second substrate of claim 1, wherein subsequent to bonding the first substrate to the second substrate, at least a portion of the plurality of precursor metal particles are disposed in a particle-alloy matrix region of the intermetallic alloy bonding layer.

6. The method of bonding a first substrate to a second substrate of claim 1, wherein the first and second low melting point metal layers each comprise a lower melting point than both the first and second high melting point metal layers.

7. The method of bonding a first substrate to a second substrate of claim 1, wherein the first and second low melting point metal layers each comprise a melting point between about 230° C. and about 260° C. and the first and second high melting point metal layers each comprise a melting point between about 600° C. and about 1500° C.

8. The method of bonding a first substrate to a second substrate of claim 1, wherein the first and second low melting point metal layers each comprise Sn and the first and second high melting point metal layers each comprise Ni, Cu, Al, Ag, or a combination thereof.

9. The method of bonding a first substrate to a second substrate of claim 1, wherein the plurality of precursor metal particles comprise between about 20% and about 40% high melting point metal particles and between about 60% to about 80% low melting point metal particles.

10. The method of bonding a first substrate to a second substrate of claim 9, wherein the high melting point metal particles comprise Ni, Cu, Al, Ag, or a combination thereof and the low melting point metal particles comprise Sn.

11. The method of bonding a first substrate to a second substrate of claim 1, the method further comprising:
    electroplating the first high melting point metal layer onto the bonding surface of the first substrate;
    electroplating the first low melting point metal layer onto the first high melting point metal layer;
    electroplating the second high melting point metal layer onto the bonding surface of the second substrate; and
    electroplating the second low melting point metal layer onto the second high melting point metal layer.

12. A method of bonding a first substrate to a second substrate, the method comprising:
    applying a plurality of precursor metal particles comprising high melting point metal particles and low melting point metal particles onto at least one surface of a first plated metal stack and a second plated metal stack, wherein:
        the first plated metal stack comprises at least one high melting point metal layer plated to at least one low melting point metal layer;
        the first plated metal stack is coupled to a bonding surface of a first substrate;
        the second plated metal stack comprises at least one high melting point metal layer plated to at least one low melting point metal layer;
        the second plated metal stack is coupled to a bonding surface of a second substrate; and
        the plurality of precursor metal particles comprise more high melting point metal particles than low melting point metal particles;
    positioning the first plated metal stack and the second plated metal stack such that the plurality of precursor metal particles contact both the first and second plated metal stacks; and
    heating the first plated metal stack, the second plated metal stack, and the plurality of precursor metal particles to form an intermetallic alloy bonding layer between the first substrate and the second substrate, wherein:
the intermetallic alloy bonding layer comprises a plurality of integrated metal particles;
the plurality of integrated metal particles comprise the high melting point metal particles of the plurality of precursor metal particles; and
the intermetallic alloy bonding layer bonds the first substrate to the second substrate.

13. The method of bonding a first substrate to a second substrate of claim 12, wherein:
the at least one high melting point metal layer of the first and second plated metal stacks comprises Ni, Cu, Al, Ag, or a combination thereof; and
the at least one low melting point metal layer of the first and second plated metal stacks comprises Sn.

14. The method of bonding a first substrate to a second substrate of claim 12, wherein the high melting point metal particles comprise Ni, Cu, Al, Ag, or a combination thereof, and the low melting point metal particles comprise Sn.

15. The method of bonding a first substrate to a second substrate of claim 12, further comprising heating the first plated metal stack, the second plated metal stack, and the plurality of precursor metal particles to a bonding temperature that is greater than a melting point of the low melting point metal layers of both the first and second plated metal stacks.

16. The method of bonding a first substrate to a second substrate of claim 12, further comprising heating the first plated metal stack, the second plated metal stack, and the plurality of precursor metal particles for a bonding period of less than 30 minutes.

17. A bonded substrate system comprising:
a first substrate;
a second substrate;
an intermetallic alloy bonding layer positioned between and bonded to the first substrate and the second substrate, the intermetallic alloy bonding layer comprising a first alloy region, a second alloy region and a particle-alloy matrix region, wherein:
the first alloy region extends between the first substrate and a first boundary region of the particle-alloy matrix region;
the second alloy region extends between the second substrate and a second boundary region of the particle-alloy matrix region;
the first and second alloy regions comprise at least one low melting point metal diffused into at least one high melting point metal; and
the particle-alloy matrix region comprises a plurality of integrated metal particles dispersed within an alloy comprising at least one low melting point metal diffused into at least one high melting point metal.

18. The bonded substrate system of claim 17, wherein the first substrate comprises a semiconductor device and the second substrate comprises a metal-ceramic-metal substrate.

19. The bonded substrate system of claim 17, wherein at least one low melting point metal of the first and second alloy regions comprise Sn and the at least one high melting point metal of the first and second alloy regions comprise Ni, Cu, Al, Ag, or a combination thereof.

20. The bonded substrate system of claim 17, wherein the plurality of integrated metal particles comprise Ni, Cu, Al, Ag, or a combination thereof.

* * * * *